(12) United States Patent
Wei et al.

(10) Patent No.: US 10,999,933 B2
(45) Date of Patent: May 4, 2021

(54) CONDUCTIVE MATERIAL AND PROCESS

(71) Applicant: HENKEL IP & HOLDING GMBH, Duesseldorf (DE)

(72) Inventors: Bin Wei, Franklin Park, NJ (US); Xiaoyan Huang, Hillsborough, NJ (US); Allison Yue Xiao, Belle Mead, NJ (US)

(73) Assignee: Henkel IP & Holding GmbH, Duesseldorf (DE)

( * ) Notice: Subject to any disclaimer, the term of this patent is extended or adjusted under 35 U.S.C. 154(b) by 0 days.

(21) Appl. No.: 14/195,239

(22) Filed: Mar. 3, 2014

(65) Prior Publication Data

US 2014/0178601 A1   Jun. 26, 2014

Related U.S. Application Data

(63) Continuation of application No. PCT/US2012/053764, filed on Sep. 5, 2012.
(Continued)

(51) Int. Cl.
| | |
|---|---|
| *H05K 3/00* | (2006.01) |
| *H05K 3/02* | (2006.01) |
| *H05K 3/10* | (2006.01) |
| *H05K 1/09* | (2006.01) |
| *C09D 11/52* | (2014.01) |
| *H01B 1/22* | (2006.01) |

(Continued)

(52) U.S. Cl.
CPC .......... *H05K 3/027* (2013.01); *B41M 5/0023* (2013.01); *C09D 11/52* (2013.01); *H01B 1/22* (2013.01); *H05K 1/092* (2013.01); *H05K 3/105* (2013.01); *H05K 3/1283* (2013.01); *H05K 2203/1131* (2013.01); *H05K 2203/125* (2013.01)

(58) Field of Classification Search
None
See application file for complete search history.

(56) References Cited

U.S. PATENT DOCUMENTS

| | | | |
|---|---|---|---|
| 3,229,265 A | | 1/1966 | Brownlow et al. |
| 4,446,059 A | | 5/1984 | Eustice |

(Continued)

FOREIGN PATENT DOCUMENTS

| | | |
|---|---|---|
| EP | 0299796 A2 | 1/1989 |
| EP | 1139703 A1 | 10/2001 |

(Continued)

OTHER PUBLICATIONS

Jiang, Hongjin, et al. "Ultra High Conductivity of Isotropic Conductive Adhesives" Electronic Components and Technology Conference, 2006, pp. 485-490.
(Continued)

*Primary Examiner* — David P Turocy
*Assistant Examiner* — Mohammad Mayy
(74) *Attorney, Agent, or Firm* — James E. Piotrowski

(57) ABSTRACT

A method for making a conductive network of sintered silver comprises preparing a conductive ink comprising a silver compound and a binder; depositing the conductive ink on a substrate and applying an external energy source to the deposited conductive ink to dry the ink; and applying an external energy source to the dried ink to decompose the ink to elemental silver and to sinter the elemental silver into a conductive network.

9 Claims, 5 Drawing Sheets

Related U.S. Application Data

(60) Provisional application No. 61/531,347, filed on Sep. 6, 2011.

(51) Int. Cl.
*B41M 5/00* (2006.01)
*H05K 3/12* (2006.01)

(56) References Cited

U.S. PATENT DOCUMENTS

| | | | |
|---|---|---|---|
| 4,626,371 | A | 12/1986 | Ikenaga et al. |
| 4,692,360 | A | 9/1987 | Manring et al. |
| 4,692,387 | A | 9/1987 | Reich |
| 5,504,138 | A | 4/1996 | Jacobs |
| 5,565,143 | A | 10/1996 | Chan |
| 5,855,820 | A | 1/1999 | Chan et al. |
| 6,143,356 | A | 11/2000 | Jablonski |
| 6,984,265 | B1 | 1/2006 | Ragues et al. |
| 7,081,214 | B2 | 7/2006 | Matsuba et al. |
| 7,211,205 | B2 | 5/2007 | Conaghan et al. |
| 7,262,511 | B2 | 8/2007 | Osako et al. |
| 7,491,646 | B2 | 2/2009 | Wu et al. |
| 2003/0108664 | A1* | 6/2003 | Kodas .......... C09D 11/30 427/125 |
| 2004/0004209 | A1 | 1/2004 | Matsuba et al. |
| 2004/0144958 | A1 | 7/2004 | Conaghan et al. |
| 2005/0116203 | A1 | 6/2005 | Takahashi et al. |
| 2005/0214480 | A1 | 9/2005 | Garbar et al. |
| 2005/0215689 | A1* | 9/2005 | Garbar ............ B82Y 30/00 524/440 |
| 2005/0238804 | A1 | 10/2005 | Garbar et al. |
| 2006/0001726 | A1 | 1/2006 | Kodas et al. |
| 2006/0038304 | A1 | 2/2006 | Osako et al. |
| 2006/0090599 | A1 | 5/2006 | Goia et al. |
| 2006/0090600 | A1 | 5/2006 | Goia et al. |
| 2006/0090601 | A1 | 5/2006 | Goia et al. |
| 2006/0159838 | A1* | 7/2006 | Kowalski ........ H01L 51/0005 427/58 |
| 2006/0189113 | A1* | 8/2006 | Vanheusden ...... B22F 1/0018 438/597 |
| 2006/0192183 | A1 | 8/2006 | Klyszcz et al. |
| 2006/0286382 | A1 | 12/2006 | Anzures et al. |
| 2007/0059646 | A1 | 3/2007 | Winscom et al. |
| 2007/0170403 | A1 | 7/2007 | Conaghan et al. |
| 2008/0020304 | A1* | 1/2008 | Schroder ......... B82Y 30/00 430/39 |
| 2008/0020572 | A1 | 1/2008 | Wu et al. |
| 2008/0062614 | A1 | 3/2008 | Goia |
| 2008/0093422 | A1 | 4/2008 | Kodas et al. |
| 2008/0105853 | A1 | 5/2008 | Ueda et al. |
| 2008/0206488 | A1* | 8/2008 | Chung ............ C09D 5/24 427/596 |
| 2009/0149589 | A1 | 6/2009 | Thompson et al. |
| 2009/0209420 | A1 | 8/2009 | Kalgutkar et al. |
| 2010/0021704 | A1 | 1/2010 | Yoon et al. |
| 2010/0126379 | A1 | 5/2010 | Tomura et al. |
| 2010/0189901 | A1* | 7/2010 | Chung ............ B22F 9/24 427/256 |
| 2010/0193751 | A1* | 8/2010 | Heo ............ H01B 1/22 252/514 |
| 2010/0233361 | A1 | 9/2010 | Hu et al. |
| 2011/0193032 | A1* | 8/2011 | Shi ............ H01B 1/16 252/519.21 |
| 2013/0010400 | A1* | 1/2013 | McConnell ........ H01G 13/02 361/321.1 |

FOREIGN PATENT DOCUMENTS

| | | |
|---|---|---|
| EP | 2285194 A1 | 2/2011 |
| JP | 2005537386 A | 12/2005 |
| JP | 2007042301 A | 2/2007 |
| JP | 2009277640 A | 11/2009 |
| JP | 2010080442 A | 4/2010 |
| JP | 2010265543 A | 11/2010 |
| JP | 2011521055 A | 7/2011 |
| KR | 1020110058307 A | 6/2011 |
| WO | 2004005413 A1 | 1/2004 |
| WO | 2004069941 A2 | 8/2004 |
| WO | 2006093398 A1 | 9/2006 |
| WO | 2006099538 A2 | 9/2006 |
| WO | 2010069894 A1 | 6/2010 |
| WO | 2010110626 A2 | 9/2010 |
| WO | 2012105682 A1 | 8/2012 |
| WO | 2014021270 A1 | 2/2014 |

OTHER PUBLICATIONS

Jiang, Hongjin, et al. "Surface Functional Silver Nanoparticles for Ultrahigh Conductive Polymer Composites." Chem. Mater., American Chemical Society, vol. 18, No. 13, 2006, pp. 2969-2973.

Jiang, Hongjin, et al. "Conductivity Enhancement of Nano Silver-Filled Conductive Adhesives by Particle Surface Functionalization." Journal of Electronic Materials, vol. 34, No. 11, 2005, pp. 1432-1439.

Moon, Kyong-Sik, et al. "Thermal Behavior of Silver Nanoparticles for Low-Temperature Interconnect Applications." Journal of Electronic Materials, vol. 34, No. 2, 2005, pp. 168-175.

Kim, H., et al. "Dye-sensitized solar cells using laser processing techniques." SPIE's LASE'2004, Jan. 26-30, 2004, San Jose, CA. Proceedings preprint, pp. 1-9.

Kipling, Kent. "Pulsed UV Light for Heat Sensitive Continuous Motion Applications." Xenon Corporation, no date.

West, J. et al. "Photonic Curing of Silver Nanoparticle Based Inks", Jan. 1, 2010, Retrieved from the Internet on Dec. 22, 2017, URL: http://www.nsti.org/publications/Nanotech/2010/pdf/850.pdf.

* cited by examiner

CONDUCTIVE MATERIAL AND PROCESS

CROSS-REFERENCE TO RELATED APPLICATION

This application is a continuation of the International Patent Application No. PCT/US2012/053764 filed Sep. 5, 2012, which claims the benefit of U.S. Provisional Patent Application Ser. No. 61/531,347 filed Sep. 6, 2011, the contents of both are incorporated herein by reference.

FIELD OF THE INVENTION

This invention relates to a method of preparing conductive ink compositions and conductive networks made from those compositions. The conductive ink compositions contain metal precursor compounds that are decomposed or reduced to the elemental metal, and then sintered to make the conductive network. These compositions are suitable for use in the formation of fine circuits for electronic devices.

BACKGROUND OF THE INVENTION

Silver has the lowest electrical resistivity among single metals, and silver oxide is also conductive, unlike the oxides of other metals. Consequently, silver is widely used with resins and polymers to prepare conductive inks and adhesives for applications within the electronics industry. When micron scale silver flakes are used, the contact between the flakes creates a contact resistance, and the numerous contact points contribute to an overall resistance of the ink or adhesive that is at least 25 to 30 times higher than would be obtained with bulk silver.

To overcome the contact resistance, silver flakes can be sintered into a continuous network. Sintering, however, requires temperatures of 850° C. or higher. Most substrates, other than ceramic or metal, cannot tolerate temperatures in this range. This limits the conductivity obtainable from micron scale silver flakes when high temperature cannot be accommodated.

In such a scenario, nanosilver provides an alternative. Nanosilver is defined here as silver particles, flakes, rods, or wires that have at least one dimension that is measured as 100 nanometers (nm) or less. Dissimilar to micro scale silver flake, nanosilver is able to both sinter at temperatures as low as 100° C. and provide sufficient conductivity for electronic end uses. In addition, nano scale silver particles can be sintered also by other external energy sources, such as, laser or UV irradiation.

The use of nanosilver particles does have drawbacks. The synthetic routes are difficult and require multiple complex separations. Surfactants are needed to keep the nanoparticles in a stable dispersion, but the surfactants must be removed to allow sintering to occur.

Moreover, a sintered network of nanosilver has very weak adhesion to low cost substrates, such as those used for printed displays, RFID tags, and photovoltaics. To overcome the weak adhesion, organic binding agents, typically polymers and/or resins, are added to the nanosilver to increase the adhesion and the mechanical strength. The presence of binding agents, however, also hinders the sintering of the nanosilver, making it difficult to obtain both high conductivity and strong adhesion from nanosilver.

An alternative approach to the use of nanosilver particles is the precursor method, in which a silver compound in a suitable solvent is decomposed by heat or other external energy to a silver film or silver particles. The introduction of a reducing agent will facilitate the reduction of the silver compound to elemental silver. In this way, chemical transformation is used to generate silver nanoparticles in situ for an application. This method has several advantages over pre-formed silver nanoparticles: the silver nanoparticles do not need to be dispersed and stabilized, the silver compound inks are liquids containing no solids, so agglomeration is not a problem, and the inks can be formulated for printing.

Nevertheless, using the precursor method causes other issues to arise. Although sufficient conductivity can be obtained from silver precursor inks, adhesion to substrates is weak. To enhance the adhesion of the silver precursor inks, a binder of polymers and/or resins is needed in the composition. The presence of the binder, however, hinders sintering by heating, and consequently, lowers conductivity.

Thus, there is a need for a means to prepare conductive networks from silver compounds, in which the conductive networks have commercially usable conductivity and adhesion to substrates.

SUMMARY OF THE INVENTION

This invention is a method for making a conductive network of sintered silver comprising: (a) preparing a conductive ink comprising a silver compound and a binder; (b) depositing the conductive ink on a substrate and applying an external energy source to the deposited conductive ink to dry the ink; (c) applying an external energy source to the elemental silver to decompose the conductive ink to elemental silver and sinter the elemental silver into a conductive network.

In one embodiment, the radiation energy is pulsed UV radiation.

This method enables the sintering of metal nanoparticles generated in situ from a metal precursor compound in the presence of polymer and/or resin binders. The presence of the polymer and/or resin binders enhances adhesion to substrates. In one embodiment, pulsed UV radiation is used as the energy source to trigger sintering of the metal nanoparticles; pulsed UV radiation does not expose substrates to high temperature, thus making this method suitable for use on sensitive substrates, such as, plastic and paper.

DETAILED DESCRIPTION OF THE INVENTION

Figure 1:
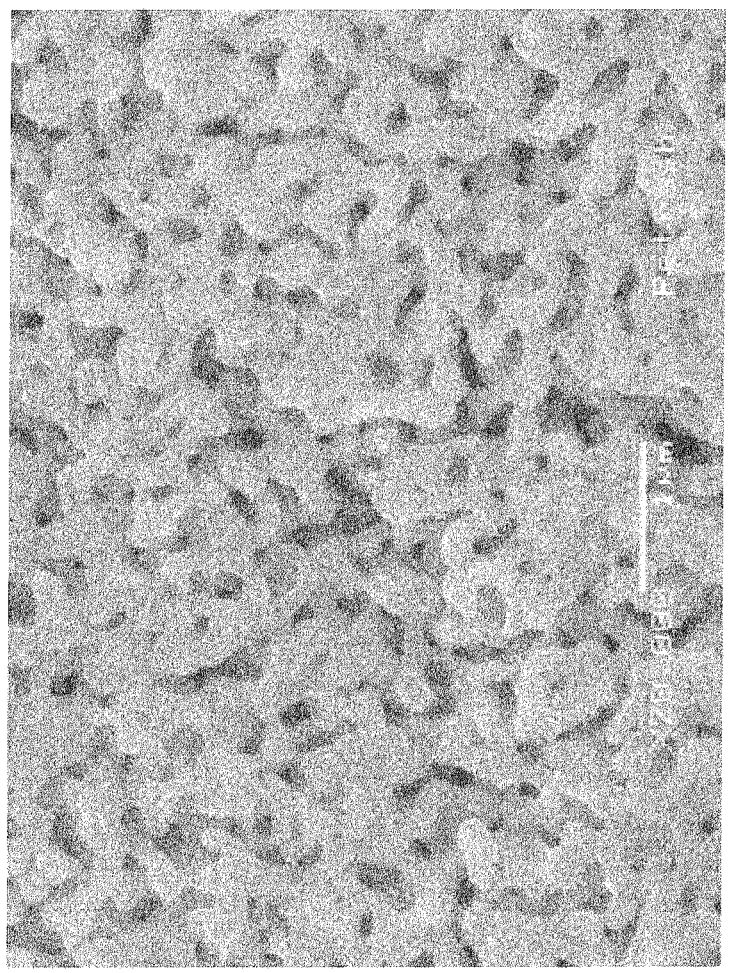
FIG. 1 is a Scanning Electron Microscope (SEM) picture of silver nanoparticles cast into a film and annealed at 150° C. for one hour.
Figure 2:
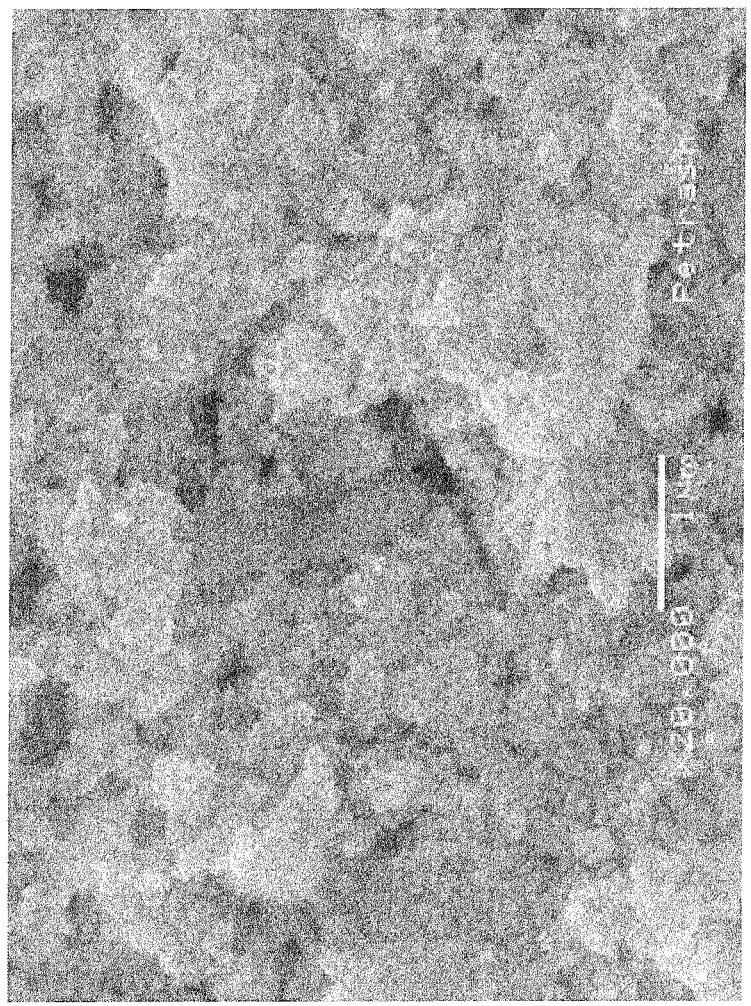
FIG. 2 is a SEM of silver nanoparticles that did not sinter in a polymer matrix. The film was heated at 230° C. for 20 minutes.

A conductive network, as used within this specification and the claims, means any configuration, pattern, trace, film, or the like, from an ink containing a silver compound that has been reduced to elemental silver, the elemental silver being subsequently sintered.

Silver compound, as used within this specification and the claims, means one or more compounds comprising silver, in which the silver is capable of being converted to elemental silver. Conversion occurs through decomposition or a reaction with a reducing agent. Silver compounds include molecules containing organic ligands with bonds from silver to O, N, or S; and inorganic silver salts.

Exemplary silver compounds include silver oxide and silver salts. Suitable silver salts include silver carbonate, silver carboxylate, silver acetate, silver formate, silver oxalate, silver propionate, silver butanoate, silver ethylhexanoate, silver neodecanoate, silver pentafluoropropionate, silver citrate, silver glycolate, silver benzoate, silver trifluoroacetate, silver phenylacetate, silver acetylacetonate, and silver hexafluoroacetyl-acetonate, for example.

The silver compounds may be used individually, or any two or more of the compounds may be used in combination. In one embodiment, the silver compound is silver formate or silver oxalate, or the combination of silver formate and silver oxalate.

The silver compound will be present in the conductive ink ranging in an amount from 1 to 70% by weight of the total conductive ink composition. In some embodiments, the lower value for the range of the amount of silver compound by weight in the total conductive ink composition will be any value or range of values from 1 to 35%; in other embodiments, the lower value will be any value or range of values from 10 to 25%; and the upper value for the range of the amount of silver compound by weight in the conductive ink composition will be any value or range of values within 35 to 70%; in other embodiments the upper value will be any value or range of values from 45 to 60%.

The value of the amount of silver compound by weight in the total conductive ink composition also can be any value or range of values within any of the lower or upper ranges.

The binder may be monomers that will polymerize in situ or polymers. Suitable polymers include polypyrrolidone, epoxies, phenolic resins, acrylics, urethanes, and silicones. Other suitable polymers include styrene allyl alcohols, polyalkylene carbonates, and polyvinyl acetals. The binder may be a single binder or one or more binders used in combination.

The binder will be present in the conductive ink in an amount from 0.1-30% by weight of the total conductive ink composition. In some embodiments the lower value for the range of the amount of the binder by weight in the total conductive ink composition will be any value or range of values from 0.1 to 15%; in other embodiments, the lower value will be any value or range of values from 5 to 10%; the upper value for the range of the amount of the binder by weight in the total conductive ink composition will be any value or range of values from 15 to 30%; in other embodiments, the upper value will be any value or range of values from 20 to 25%. The value of the amount of binder by weight in the total conductive ink composition also can be any value or range of values within any of the lower or upper ranges.

When a reducing agent is used, it will be selected from one or more compounds that are capable of being oxidized, and therefore, capable of reducing the silver compound to elemental silver (silver with a valence of 0). The amount of reducing agent will be added in a stoichiometric ratio to silver of around one, but can be adjusted by the practitioner as needed. Suitable reducing agents are selected from the group consisting of amines, oximes, guanidines, carbazones, alcohols and polyols, hydrazines, hydrazones, hydrazides, aldehydes, and amides.

In one embodiment the reducing agent is an alkyl amine or an aromatic amine. Suitable amines include, for example, butyl amine, nonylamine, dibutyl amine, tributyl amine, diethylene amine, tetraethylene pentamine, octylamine, triethyl amine, and isopropanolamine. In one embodiment, the reducing agent is octylamine.

In another embodiment the reducing agent is an oxime. Suitable oximes include aldoximes and ketoximes. In one embodiment, the oximes are selected from acetoneoxime, methylaldoxime, and methylethylketoxime.

Further exemplary reducing agents include methanol, ethanol, isopropanol, terpineol, t-butanol, ethylene glycol, diethylene glycol, triethylene glycol, ethylene glycol diacetate, formaldehyde, octanal, decanal, dodecanal, and dimethylformamide.

Binders and reducing agents can be in the form of liquids or solids. More than one binder and more than one reducing agent can be used within a conductive ink. This gives the practitioner formulating leeway, not only with respect to selection of the performance properties of the binder and reducing agent, but also to the selection of whether to use a liquid or a solid binder or reducing agent for adjusting viscosity.

In some embodiments, it may be helpful to add solvent to aid in dissolving the components of the composition or to adjust viscosity. In such cases, suitable solvents include alcohols, ethers, esters, acetone and water, either alone or in combination.

Typically, the total liquid medium forms 20 to 90% by weight of the composition, including any solvent, liquid binder, and liquid reducing agent that are present.

The composition may further comprise a conductivity-promoting component such as oxalic acid and/or formic acid, although the conductivity achieved even without such a component will be close to that of bulk silver.

Where suitable, components of one embodiment of the invention may be combined with any other components of another embodiment of the invention.

The conductive ink compositions are deposited onto substrates in whatever pattern and amounts are required for the end use. Typical commercially used substrates include epoxy circuit board, glass, paper, plastics (including polyesters such as polyethylene terephthalate) and polyimides. Exemplary end uses include thin film transistors, flexible displays, photovoltaics, RFID devices, and conductive traces.

Deposition can be accomplished by various printing means currently used in the art; exemplary means include ink jet printers, aerosol jets, automated syringes, lithographic printers, vacuum deposition or sputtering devices, and flexo, gravure, or screen printing means. Suitable viscosities for these deposition means will depend on the means chosen and can be determined by the practitioner without undue experimentation.

After deposition, the conductive ink is dried by subjecting it to an external energy source. In some cases, the external energy source might also decompose the silver compound. The external energy can be any of heat, microwave, and UV, IR or visible radiation. The radiation can be pulsed or continuous.

In one embodiment, heat is used as the external energy, at a temperature or a temperature range from 25° to 200° C.; the lower value for the temperature range will be any value or range of values from 25° to 100° C.; in other embodiments, the lower value will be any value or range of values from 50° to 75° C.; the upper value for the temperature range will be any value or range of values from 100° to 200° C.; in other embodiments, the upper value will be any value or range of values from 130° to 170° C. The temperature or temperature range can be any value or range of values within any of the lower or upper ranges. The time period for which the application of heat occurs to decompose the silver compound will vary with the composition, and in general will be in the range from one minute to two hours.

After the application of energy to dry the ink, the deposited ink is subjected to additional external energy, which decomposes the silver compound to elemental silver, and sinters the elemental silver into a conductive network. The elemental silver typically will be present in the form of nanoparticles. The generation of particles and sintering can take place either simultaneously or consecutively. The surface plasma effect of metal nanoparticles offers an opportunity to use ultraviolet (UV) light for sintering. In particular, pulsed UV light concentrates energy as high as thousands of Joules in a single pulse that can be as short as milliseconds.

The invention also relates to a process for manufacturing a conductive ink comprising a silver compound and a binder. In one embodiment, the silver compound is a silver complex formed by reaction of at least one of silver formate or silver oxalate with a stabilizing agent, in a suitable liquid medium. The stabilizing agent will act as a ligand to form a complex with silver ion in the liquid medium. Examples of suitable stabilizing agents are one or more of the reducing agents mentioned above. The suitable liquid medium will be one or more of the solvents mentioned above. The reaction will take place at a temperature just lower than 0° C.

After reaction, the amount of liquid medium may be reduced to increase the silver compound concentration; in one embodiment, the liquid medium may be drawn off by vacuum while being maintained at a temperature just lower than 0° C.

EXAMPLES

Example 1

Formulation of Conductive Ink

Silver oxalate was prepared from silver nitrate and oxalic acid dihydrate in aqueous solution. Oxalic acid dehydrate, 30 g, was dissolved in 350 ml water. Separately, silver nitrate, 30 g, was dissolved in 120 ml water. The silver nitrate solution was added to the oxalic acid solution dropwise with stirring, causing a white precipitation of silver oxalate to immediately appear. When the reaction was completed, the solution was filtered using 1 μm filter paper to isolate the precipitate. The isolated precipitate was washed with water twice to remove the soluble components and residual acid; then further washed with ethanol twice.

The isolated silver oxalate, 25 g, was added to 50 g of ethanol, and formed a suspension. The suspension was continuously stirred and cooled in an ice bath. Then 50 g of isopropanolamine was added to the suspension dropwise over ten minutes. Octylamine, 12.5 g, was added, at which point the silver oxalate started dissolving. The sample was taken out of the ice bath and stirring was continued at room temperature for about two hours until a pale yellow solution was obtained. This solution was aged at room temperature for up to two weeks. Some dark precipitation was observed during the aging. After aging, the solution was centrifuged at 8000 rpm for 30 minutes to remove the solid content, leaving a transparent light yellow ink. The loading level of silver in the ink was about 11% by weight. The ink was stored in darkness at room temperature and remained stable for more than nine months.

Polyvinylpyrrolidone (PVP) was dissolved in the ink above. An exemplary concentration of PVP in the ink is 1.1% w. The composition of the ink is shown in Table 1.

TABLE 1

COMPOSITION OF EXAMPLE 1.

| Components | Percentage by Weight |
| --- | --- |
| Silver oxalate | 18.0 |
| Ethanol | 35.9 |
| Isopropanolamine | 35.9 |
| Octylamine | 9.0 |
| PVP | 1.2 |
| Total | 100 |

Example 2

Evaluation of Conductivity and Adhesion

To evaluate the conductivity of the ink from Example 1, a glass slide (25×25 mm) was dipped into a pool of the ink until coated with the ink. Immediately the coated slide was placed on a hot plate held at a temperature between 120° to 130° C. for 30 minutes until the silver oxalate decomposed and silver nanoparticles formed. (The silver nanoparticles were not deposited in any pattern; when dipped into the pool of ink, they instead formed a coating or film of nanoparticles. In commercial applications, the inks would have been deposited in predetermined patterns to form conductive traces.)

The resistance of the ink was measured with a 302 Resistivity Stand from Lucas Labs, which uses a standard four-wire probe. The geometric dimensions of the films were measured with a standard ruler. The film thickness was measured with a white light interferometer, WyKo NT3300 Interferometer from Veeco.

Figure 3:
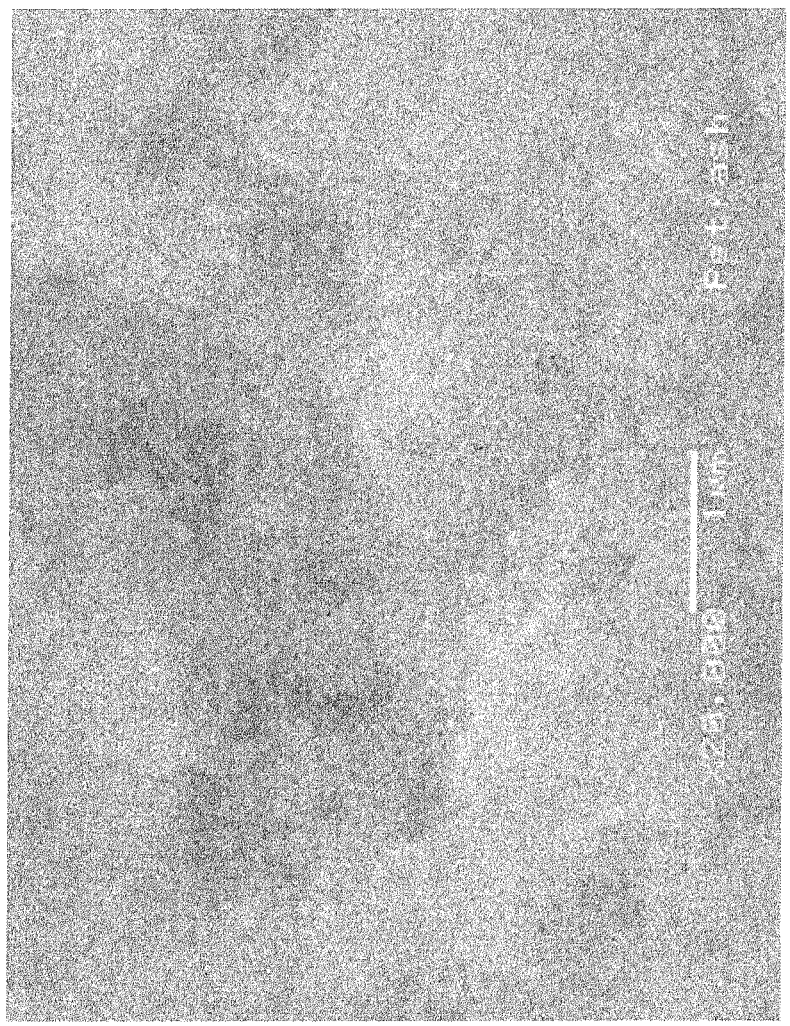
FIG. 3 is a SEM of silver nanoparticles generated in situ and heated at 120° C. for 30 minutes. There is no evidence of sintering.

The results of eight samples of the composition from Example 1 are listed in Table 2. The resistance of all the ink samples was in the order of mega-ohms (>$10^6$ ohms) after heating at 120° C. or 130° C. for 30 minutes, which indicates that the ink is essentially non-conductive after the heating. Referring to FIG. 3, it can be seen that although silver nanoparticles were generated in situ when the ink was heated, they did not sinter. This accounts for the fact that the inks are essentially non-conductive.

After the heating, the films were exposed to a UV pulse generated with a SINTERON2000 or SINTERON 500 of Xenon Corporation. The Sinteron 2000 provides UV pulses of 1270 to 2070 Joules per pulse. The Sinteron 500 provides 830 Joules per pulse. After a single UV pulse, the resistance of each of the films dropped by at least 8 orders of magnitude. The results are set out in Table 2.

Figure 4:
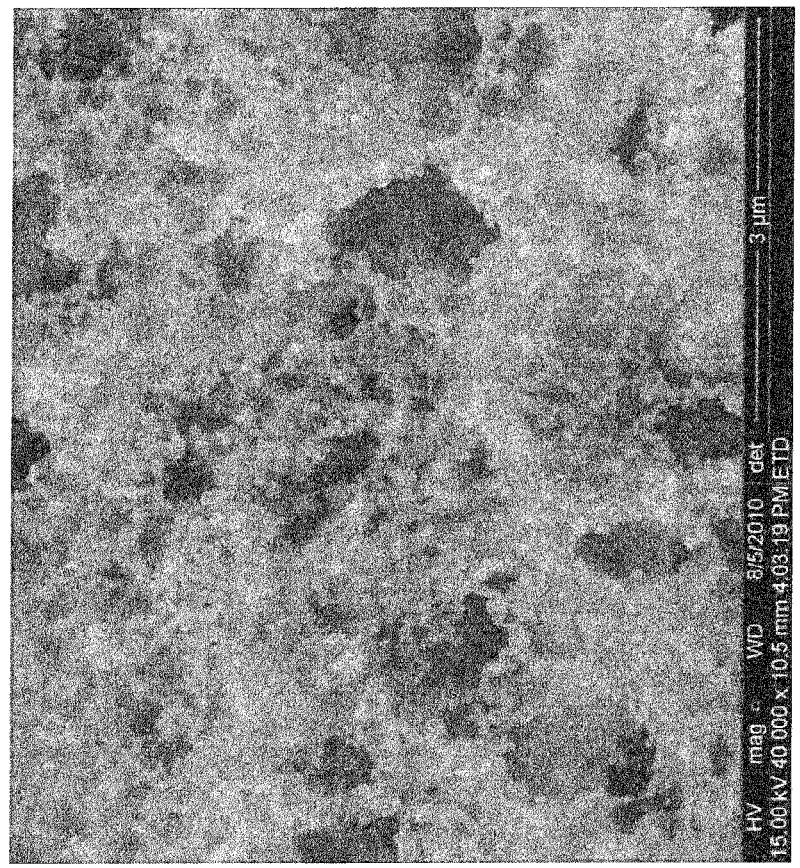
FIG. 4 is a SEM of sintered silver nanoparticles that were generated from silver oxalate in situ in a polymer matrix. The polymer remains in the background of the microscopy picture.
Figure 5:
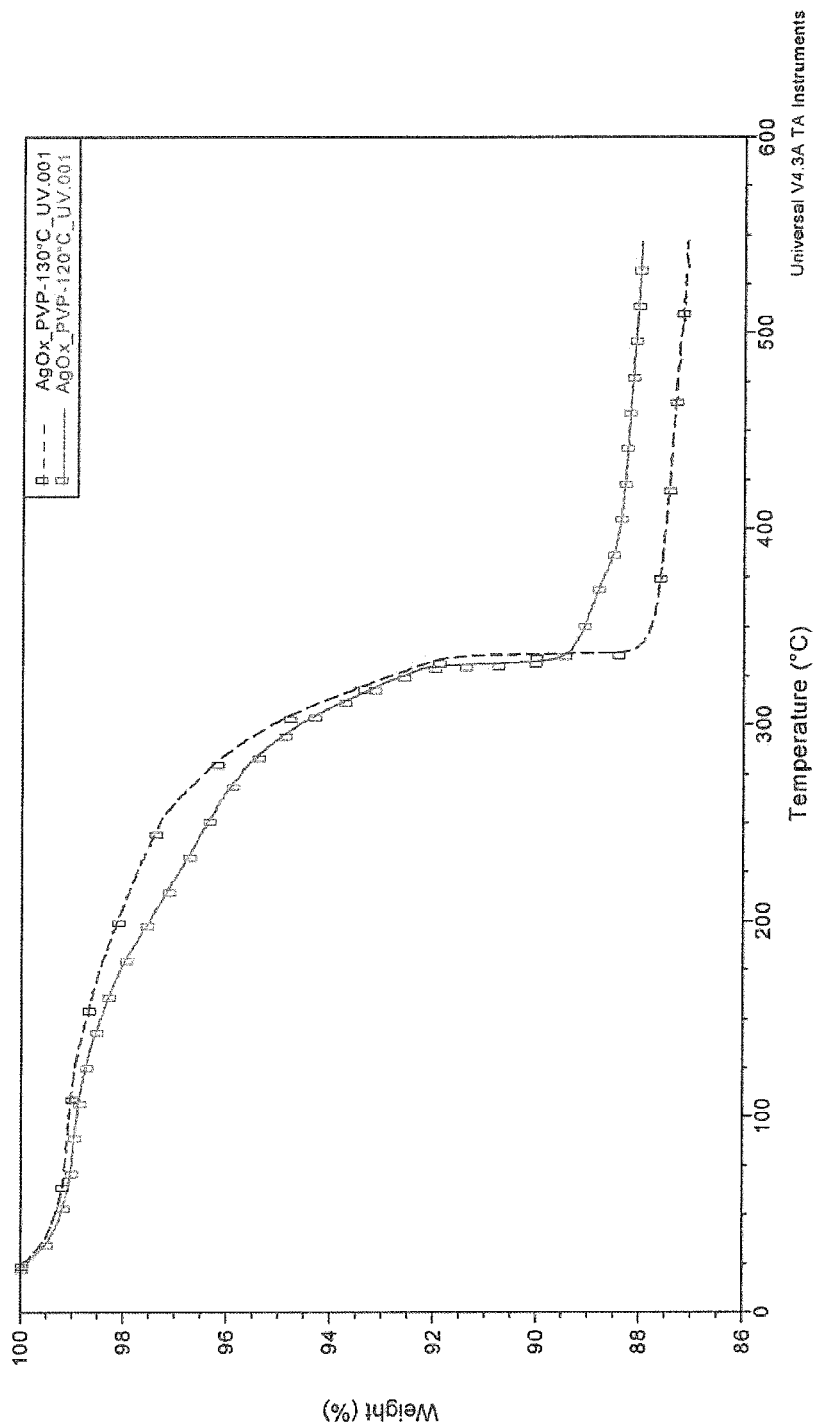
FIG. 5 is a TGA graph of conductive films after annealing and UV exposure. The films were annealed at 120° C. or 130° C. for 30 minutes before being exposed to UV. The weight loss in TGA is consistent with the amount of polymer added into the ink.

The lowering of the resistance after UV pulse exposure indicates that a conductive network was formed from the nanoparticles. SEM shown in FIG. 4 confirmed that the silver nanoparticles sintered and formed a continuous metal network; in the background of the metal network, polymer is clearly visible. Thermogravimetric analysis (TGA) shown in FIG. 5 confirmed that the polymer largely remained intact after the heating and UV exposure. This evidences that silver nanoparticles were generated and sintered within a polymeric matrix. This conclusion is consistent with the low resistance, SEM morphology, and the TGA.

TABLE 2

RESISTANCE OF CONDUCTIVE PATTERNS

| Sample | Heating Temperature and Time | Resistance after Heating and before UV Exposure (>10⁶ ohms) | Resistance after UV Exposure | UV Pulse Energy |
|---|---|---|---|---|
| 1 | 120° C. 30 min | Mega ohms | 0.018 ohm | 2070 Joules |
| 2 | 120° C. 30 min | Mega ohms | 0.020 ohm | 1270 Joules |
| 3 | 120° C. 30 min | Mega ohms | 0.072 ohm | 830 Joules |
| 4 | 120° C. 30 min | Mega ohms | 0.024 ohm | 1270 Joules |
| 5 | 130° C. 30 min | Mega ohms | 0.058 ohm | 830 Joules |
| 6 | 130° C. 30 min | Mega ohms | 0.077 ohm | 830 Joules |
| 7 | 130° C. 30 min | Mega ohms | 0.021 ohm | 1270 Joules |
| 8 | 130° C. 30 min | Mega ohms | 0.020 ohm | 1270 Joules |

The adhesion of the inks to the glass substrate was tested with SCOTCH brand tape from 3M. The tape was pressed onto the surface of the sintered inks. The tape was then peeled off at a 90° angle. A scale of 1 to 5 was used to indicate the adhesion strength. If no material was removed from the film, the adhesion was deemed strong and numbered "5". If the film was completely removed from the substrate, the adhesion was deemed weak and numbered "1". The adhesion of the films in this Example ranged from 3 to 4.

Example 3

Comparative Ink from Pre-Made Silver Nanoparticles

Nanosilver paste (product R7000-95 from Ferro Corporation) was diluted with carbitol so that the silver concentration was 20% by weight. Polyvinylpyrrolidone (PVP) was added to the solution to bring the concentration of PVP to 2% by weight, creating a ratio between silver and PVP of 10 to 1. The solution was thoroughly mixed at 3000 rpm for 30 seconds (SpeedMixer, Houschild, Model DAC150SP).

The nanoparticle ink was coated onto a silicon wafer by spin-coating and annealed at 120° C. or 130° C. for 30 minutes. The resistance of the ink was measured with four-point probe. After this first resistance measurement, the films were exposed to pulse UV and then the resistance was measured again. The samples and results are listed in Table 3. The films became conductive after heating, but further exposure to UV pulses did not decrease the resistance significantly. The level of resistance obtained is an order of magnitude greater than for the inventive films and indicates that the nanosilver particles did not sinter into a network.

The PVP binder, however, did provide strong adhesion of the inks to the silicon substrate as tested by the adhesive tape test described in Example 2. The adhesion of the films to the substrate was 4.

TABLE 3

RESISTANCE OF FILMS IN COMPARATIVE EXAMPLE

| Sample | Heating Temperature and Time | Resistance after Heating and before UV Exposure | Resistance after UV Exposure | UV pulse energy | Number of pulses |
|---|---|---|---|---|---|
| 1 | 120° C. 30 min | 0.46 ohms | 0.41 ohms | 830 Joules | 1 |
| 2 | 120° C. 30 min | 0.36 ohms | 0.32 ohms | 1270 Joules | 4 |
| 3 | 120° C. 30 min | 0.32 ohms | 0.31 ohms | 1677 Joules | 4 |
| 5 | 130° C. 30 min | 0.29 ohms | 0.25 ohms | 830 Joules | 1 |
| 6 | 130° C. 30 min | 0.23 ohms | 0.21 ohms | 2070 Joules | 1 |

The invention claimed is:

1. A method for making a conductive network of sintered silver in an organic matrix comprising:
   (a) depositing an ink consisting essentially of a silver compound, a reducing agent, an organic binder and an optional solvent,
       wherein the silver compound is silver oxalate and is present in an amount of about 18% by weight, based on the total weight of the ink;
       wherein the reducing agent comprises isopropanolamine in an amount of about 36% by weight, octylamine in an amount of about 9% by weight, and ethanol in an amount of about 36% by weight, each based on the total weight of the conductive ink composition;
       wherein the organic binder includes polyvinylpyrrolidone and is present in the amount of about 0.1-30% by weight of the total ink and forms into the organic matrix; on a substrate and applying an external energy source to dry the deposited ink; and
   (b) applying an additional external energy source to the dried ink to decompose the silver compound to elemental silver and to sinter the elemental silver into a conductive network in the organic matrix,
       wherein the additional external energy source comprises pulsed UV irradiation, and
       wherein the organic matrix remains substantially intact following pulse UV irradiation.

2. The method according to claim 1, in which the silver compound is a combination of silver formate and silver oxalate.

3. The method according to claim 1 in which the reducing agent further comprises methanol, isopropanol, terpineol, t-butanol, ethylene glycol, diethylene glycol, triethylene glycol, ethylene glycol diacetate, formaldehyde, octanal, decanal, dodecanal, or dimethylformamide.

4. The method according to claim 1 in which the external energy source to dry the ink is heat at a temperature or within a temperature range from 25° to 200° C.

5. The method of claim 1, wherein the reducing agent further includes an oxime, guanidine, carbazone, a further alcohol, polyol, hydrazine, hydrazine, hydrazide, aldehyde, or amide.

6. The method of claim 1, wherein after applying pulsed UV irradiation, resistance drops by at least eight orders of magnitude.

7. A method for making a conductive network of sintered silver in an organic matrix comprising:
   (a) depositing an ink consisting of a silver compound, a reducing agent, an organic binder, and an optional solvent,
       wherein the silver compound is silver oxalate;

wherein the silver compound is about 18% by weight of the total conductive ink composition;

wherein the reducing agent comprises isopropanolamine in an amount of about 36% by weight, octylamine in an amount of about 9% by weight, and ethanol in an amount of about 36% by weight, each based on the total weight of the conductive ink composition;

wherein the organic binder includes polyvinylpyrrolidone and is present in the amount of about 0.1-30% by weight of the total ink and forms into the organic matrix on a substrate and applying an external energy source to dry the deposited ink; and (b) applying an additional external energy source to the dried ink to decompose the silver compound to elemental silver and to sinter the elemental silver into a conductive network in the organic matrix, wherein the additional external energy source comprises pulsed UV irradiation and wherein the organic matrix remains substantially intact following pulse UV irradiation.

8. The method of claim 7, wherein the reducing agent further includes an oxime, guanidine, carbazone, a further alcohol, polyol, hydrazine, hydrazine, hydrazide, aldehyde, or an amide.

9. The method of claim 7, wherein after applying pulsed UV irradiation, resistance drops by at least eight orders of magnitude.

* * * * *